US008187028B2

(12) United States Patent
Feigl

(10) Patent No.: US 8,187,028 B2
(45) Date of Patent: May 29, 2012

(54) DISTRIBUTION STRIP AND EQUIPMENT CABINET

(75) Inventor: Josef Feigl, Arnstorf (DE)

(73) Assignee: Knuerr AG, Arnstorf (DE)

( * ) Notice: Subject to any disclaimer, the term of this patent is extended or adjusted under 35 U.S.C. 154(b) by 0 days.

(21) Appl. No.: 13/122,847

(22) PCT Filed: Oct. 1, 2009

(86) PCT No.: PCT/EP2009/007056
§ 371 (c)(1),
(2), (4) Date: Apr. 6, 2011

(87) PCT Pub. No.: WO2010/040475
PCT Pub. Date: Apr. 15, 2010

(65) Prior Publication Data
US 2011/0195600 A1 Aug. 11, 2011

(30) Foreign Application Priority Data

Oct. 7, 2008 (DE) .......................... 10 2008 050 700

(51) Int. Cl.
*H01R 13/60* (2006.01)
(52) U.S. Cl. ..................................................... 439/540.1
(58) Field of Classification Search ............... 439/540.1, 439/534, 954, 652, 532; 361/622–624, 610
See application file for complete search history.

(56) References Cited

U.S. PATENT DOCUMENTS

| 6,229,691 | B1 * | 5/2001 | Tanzer et al. ................. | 361/622 |
| 6,826,036 | B2 * | 11/2004 | Pereira ........................... | 361/624 |
| 7,215,535 | B2 * | 5/2007 | Pereira ........................... | 361/624 |
| 7,365,964 | B2 * | 4/2008 | Donahue, IV ................ | 361/622 |
| 7,979,985 | B2 * | 7/2011 | Spitaels et al. ................. | 29/876 |
| 8,004,827 | B2 * | 8/2011 | Ewing et al. .................. | 361/623 |
| 2001/0026436 | A1 * | 10/2001 | Tanzer et al. ................ | 361/610 |
| 2002/0012242 | A1 | 1/2002 | Lecinski et al. | |
| 2005/0000786 | A1 | 1/2005 | Huang | |
| 2005/0094357 | A1 | 5/2005 | Ewing et al. | |
| 2007/0072487 | A1 | 3/2007 | Gorman | |
| 2008/0029428 | A1 | 2/2008 | Kolada | |

OTHER PUBLICATIONS

International Search Report for PCT/EP2009/007056, ISA/EP, Rijswijk, NL, mailed Feb. 11, 2010 (6 pages).
English translation of the International Preliminary Report on Patentability (Chapter II of the Patent Cooperation Treaty) mailed May 6, 2011 from corresponding International Application PCT/EP2009/007056 (6 pages).

* cited by examiner

*Primary Examiner* — Jean F Duverne
(74) *Attorney, Agent, or Firm* — Harness, Dickey & Pierce, P.L.C.

(57) ABSTRACT

The invention relates to a distribution strip for distributing electric energy for equipment and/or server cabinets (50), comprising a plurality of electric connecting devices (30, 32) to which electric loads can be connected, at least one feed cable (20) for connecting the distribution strip (1, 2, 3) to an energy source, and at least one fastening region for fastening the distribution strip to the equipment and/or server cabinet. According to the invention, the electric connecting devices are arranged on a first longitudinal side of the distribution strip and at least one connecting cable is arranged on a second longitudinal side of the distribution strip adjoining the first longitudinal side. The distribution strip can be fixed by means of the fastening region in a vertical orientation in the region of a side wall (60, 62) to the equipment and/or server cabinet.

16 Claims, 3 Drawing Sheets

DISTRIBUTION STRIP AND EQUIPMENT CABINET

CROSS-REFERENCE TO RELATED APPLICATIONS

This application is a 371 U.S. National Stage of International Application No. PCT/EP2009/007056, filed Oct. 1, 2009. This application claims priority to German Patent Application No. 10 2008 050 700.8, filed Oct. 7, 2008. The disclosures of the above applications are incorporated herein by reference.

The invention relates to a distribution strip for distributing electrical energy for equipment and/or server cabinets, comprising a plurality of electrical connection devices, to which electrical consumers can be connected, at least one feed cable for connecting the distribution strip to an energy source and at least one fixing region for fixing the distribution strip to the equipment and/or server cabinet.

The invention further relates to an equipment cabinet for receiving electrical and/or electronic equipment, in particular a server cabinet.

Distribution strips are used to distribute electrical energy to electrical and/or electronic equipment or structural units which are arranged in an equipment and/or server cabinet. In more general terms, a distribution strip supplies electrical consumers with energy. Such supplied equipment or structural units are constituted for example by servers such as blade servers, telecommunications equipment, switches or air conditioning equipment.

The distribution strip which can also be described as a socket strip is vertically orientated in most cases in known equipment cabinets.

In order to connect the distribution strip to an energy source, for example a power network, a feed cable is guided out of the distribution strip. This is laid appropriately through the equipment cabinet and guided out thereof for connection to a power connection such as a mains socket. The feed cable can also be connected to the building or computer centre energy supply.

In addition to such essentially independent distribution strips, it is also known to form electrifying devices integrally with the equipment cabinet.

The equipment and consumers housed in equipment or server cabinets are becoming ever more powerful. Their energy consumption also hereby increases. In addition there is a trend to house an increasingly large number of devices in an equipment or server cabinet. Both developments lead to an overall increasing energy requirement in an equipment or server cabinet and thus require increasingly powerful distribution systems for the distribution of electrical energy to the equipment and consumers to be supplied.

In order to provide the high current strengths or capacities for the consumers it is necessary to dimension the feed cables correspondingly to the distribution strips. It is thus endeavoured to enlarge the diameters of the feed cables. This reduces additional line losses in these cables.

Due to the limited space available within an equipment cabinet such feed cables with large diameters can cause problems. In particular the comparatively large bending radii which result from the large diameters of the cables frequently create problems in laying, as the possible bending radii for the feed cables when using generic distribution devices are mostly only very small.

It is an object of the invention to create a distribution strip which facilitates a powerful energy supply to a large number of consumers and an equipment cabinet with a powerful energy supply.

The object is achieved according to the invention through a distribution strip having the features of claim 1 and an equipment cabinet having the features of claim 10. Preferred embodiments of the invention are indicated in the respective dependent claims.

It is provided in the distribution strip according to the invention that the electrical connection devices are arranged on a first longitudinal side of the distribution strip, that the at least one feed cable is arranged on a second longitudinal side of the distribution strip adjacent to the first longitudinal side and that the distribution strip can be fixed or arranged on the equipment and/or server cabinet by means of the fixing region in a vertical orientation in the area of a side wall. According to the invention such a distribution strip is arranged in the equipment cabinet.

The starting point for the invention is a separate distribution strip for an equipment and/or server cabinet with a feed cable for connection to a power supply, for example a power network. Such distribution strips have the advantage over electrifying devices formed integrally with a cabinet that they can be used considerably more flexibly on different equipment cabinets.

A core idea of the invention can be seen in creating a distribution strip, of which the feed cable can be laid even with large diameter and associated large bending radius without complications within an equipment cabinet.

An essential aspect of the invention consists in connecting the feed cable of the distribution strip not—as known in the prior art—to the short end faces but instead to a lateral longitudinal side of the distribution strip. The lateral longitudinal side adjoins a front longitudinal side which can also be described as the front side of the distribution strip. The connection devices are also arranged on this longitudinal side. The lateral longitudinal side is generally approximately at a right angle to the front longitudinal side. The distribution strip can hereby have an essentially cuboid form.

The inventive arrangement of the feed cable on a lateral longitudinal side of the distribution strip has the advantage that the feed cable can be guided into a space within the equipment cabinet which is usually unused and offers sufficient space to guide the cable with great curvature, i.e. with large bending radii.

A further advantage of the inventive distribution strip consists in that the lateral longitudinal side, particularly in comparison with the end faces, offers adequate space for further feed cables. The performance capacity of the distribution strip, that is to say the maximum energy that can be distributed to consumers through the distribution strip, can hereby be increased.

The inventive distribution strip is provided in particular to be arranged in a corner region of an equipment cabinet in vertical orientation. For this, at least one fixing region is provided on the distribution strip according to the invention in order to fix the distribution strip to the equipment cabinet, in particular to struts or frame profiles provided there. The fixing region can for example be formed as an adhesion surface or can comprise fixing means such as suitable detent means, screws and/or holes.

The vertical arrangement of the distribution strip has the advantage over the known horizontal arrangement that the distribution strip does not take up any space which could otherwise be alternatively used, in particular for example for further equipment. The devices are often incorporated or inserted into an equipment cabinet in such a way that there is a distance from the side walls. This lateral space can be used by the inventive distribution strip. More consumers or electrical and electronic devices can thereby be provided in the rack region of the cabinet, as the distribution system is provided beside the actual rack. The number of devices within a cabinet can thus be increased. It is thereby provided in particular that the feed cable is guided along a lateral region of the equipment cabinet. Virtually the whole depth of the equipment cabinet is thus available as a radius for the feed cable. Large cables with a large diameter or thick cables can thus be used for a powerful energy supply, as the bending radii necessary for such cables are facilitated.

It is preferable if the at least one feed cable is connected essentially centrally to the second longitudinal side of the distribution strip. The term "centrally" is to be understood in particular as the region around the centre having regard to a longitudinal axis of the distribution strip which extends parallel to the longitudinal sides. The central arrangement of the feed cable has the advantage that there is space for laying the feed cable both above and below. The feed cable can thus be guided out of the equipment cabinet with a large bending radius both upwardly and downwardly.

In principle the feed cable can be fixedly connected to the distribution strip. However, it is also possible for the feed cable to be connected to the distribution strip in a detachable manner, in particular through a plug-in and/or rotary connection. High flexibility is hereby achieved in relation to the choice of the feed cable, in particular its length.

A preferred embodiment of the distribution strip consists in that a plurality of, in particular three, feed cables are provided. It is thereby possible for the cables to be assigned to different current connections or phases, for example to a regular mains connection, to an interruption-free power supply and/or to a stand-by generator. In case of connection to a three phase network with several phases it is also possible to conduct respectively selected phases via selected feed cables. It is possible for example to feed a different phase to each of the three feed cables if three feed cables are used.

In a further preferred embodiment it is provided that the electrical connection devices are divided into several groups, in particular being functionally separated from each other. For example one or more groups can be assigned to a respective feed cable so that a plurality of current or supply circuits which are independent from each other are formed. It can hereby be ensured in the construction of a server cabinet with the distribution strip that for example particularly important devices are connected to additionally secured groups or current circuits. This additional security can be provided for example by an additional interruption-free power supply or similar.

In order to increase the flexibility of the distribution strip it is preferable for different electrical connection devices to be provided. The electrical connection devices can be for example corresponding sockets or female connectors for cold plugs, hot plugs and/or Schuko plugs. It is also possible to provide different types of connections for different cold plugs or other different plug types.

It is provided in an advantageous embodiment that a data connection device for transmission of data and/or a measurement module is/are arranged on the distribution strip. The measurement module can be adapted for example to measure the current consumption of individual consumers, consumer groups or the current of the feed cables. The measurement module can furthermore provide information concerning connected devices, for example the number thereof. By means of the data connection device such data or other data can be interrogated for management of the distribution strips, for example via a network.

The user-friendliness of the distribution strip can be increased by providing a display device. The display device can be used for example to indicate the number of devices connected and/or a current power consumption of the devices. Visual monitoring of the distribution strip on site is thereby facilitated.

A distribution strip allowing versatility of use is achieved in that fixing devices are provided which allow fixing of the distribution strip in an equipment or server cabinet in at least two orientations, whereby the distribution strip is rotated in a second orientation by 180° about its transverse axis in relation to a first orientation. For example fixing devices can be provided respectively in a lower and an upper region of the distribution strip, said fixing devices having essentially the same formation, so that the distribution strip can be fixed in an upside-down orientation to an equipment cabinet, in which an upper and a lower side are exchanged. One and the same distribution strip can thus be used for two different arrangement positions.

The flexibility of the distribution strip can further be increased by providing at least two inscriptions which are rotated by 180° relative to each other. It is hereby ensured that the inscriptions of the distribution strip can be easily read upon rotation of the distribution strip irrespectively of the orientation.

The inventive equipment cabinet is further developed in an advantageous embodiment in that the distribution strip is vertically arranged in a first corner region in the area of a side wall of the cabinet. It is advantageous if the feed cable is guided essentially horizontally out of the distribution strip and guided upwardly or downwardly in a curve along a side wall of the cabinet. The feed cable is thus guided between devices arranged in the equipment cabinet and an inner surface of a side wall. This region is generally unused and offers adequate space for a feed cable laid with a large bending radius.

For flexible use of the distribution strip in different corner regions of the equipment cabinet it is provided in an advantageous embodiment that the distribution strip can be fixed in a first orientation in a first corner region of the equipment cabinet and in a second orientation in a second corner region of the equipment cabinet lying opposite the first corner region, whereby the distribution strip is rotated in the second orientation by 180° about is transverse axis in relation to the first orientation. A transverse axis is intended in particular to mean an axis which extends perpendicular to a longitudinal axis of the distribution strip and parallel to the front side and to the end faces. In other words, the transverse axis can be regarded as an extension of a centrally provided feed cable. Through the laterally arranged feed cable the distribution strip can be rotated for arrangement on an opposite lying corner region not merely about its longitudinal axis. It is thus provided that the distribution strip can be rotated so that the upper and lower side are exchanged and the distribution strip is arranged upside-down at the second corner of the equipment cabinet. In this connection the dual inscriptions of the distribution strip, rotated by 180°, are also advantageous.

In order to provide as short as possible paths between a device to be connected and a connection device of the distribution strip it is preferable if the distribution strip has a length which corresponds essentially to the height of the inner space of the cabinet. It is hereby possible to provide merely extremely short power cables for the consumers provided in the cabinet, as a connection device is already provided at the same height as a consumer incorporated into the rack.

In addition a large number of connection devices can be made available with such a long distribution strip. Due to the short power cables a better overview of the connections can thus be provided. It is preferable in this connection also for the connection devices to be divided into groups which can be assigned for example to a certain section of the cabinet.

It is also preferable for two distribution strips to be arranged in or on an equipment cabinet, whereby a first distribution strip is arranged in a first corner region of the cabinet and a second distribution strip in a second corner region of the cabinet. The number of available connection devices can hereby be further increased.

The fundamental ideas behind the invention can be seen accordingly in the provision of a distribution strip or socket strip with lateral cable guiding. Furthermore it is to be possible to rotate the distribution strip about its transverse axis by 180° so that it can be incorporated at different positions of a server or electronic cabinet.

The invention is described further below by reference to the drawings, in which.

Figure 1:
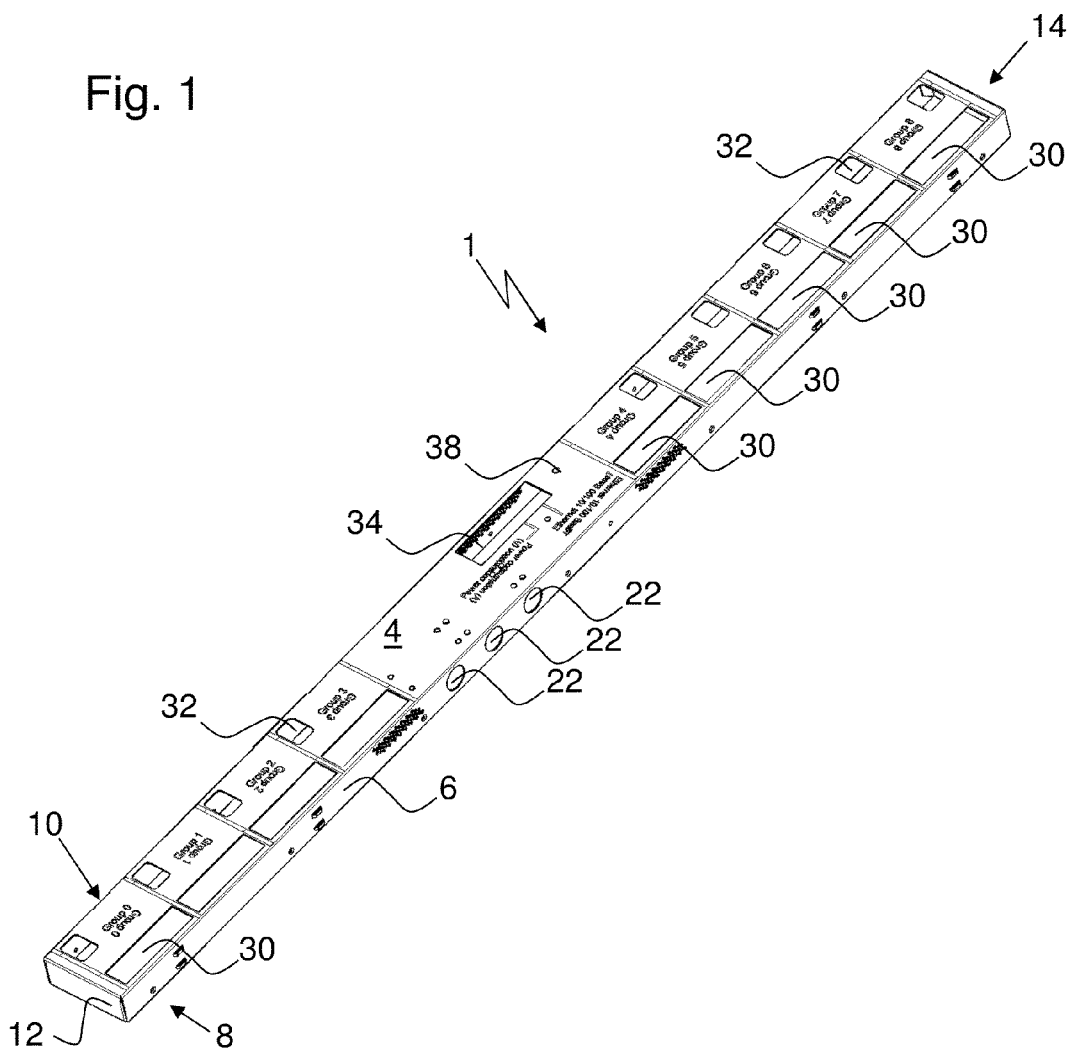
FIG. 1 shows a perspective view of an inventive distribution strip.

FIG. 1 shows a perspective view of an inventive distribution strip 1. The distribution strip 1 has an essentially cuboid outer contour with four longitudinal sides 4, 6, 8, 10 and two end faces 12, 14. The end faces 12, 14 are rectangular, so that the distribution strip 1 overall has an elongated, flat form. On a first longitudinal side 4 of the distribution strip 1, which can also be described as the front side, a plurality of connection devices 30, 32 are arranged for the connection of electrical and/or electronic components. The connection devices 30, 32, which are shown only schematically in FIG. 1, can for example be cold connection sockets, to which connection cables with corresponding plugs can be connected. The connection devices 30, 32 constitute power outlets of the distribution strip 1.

In order to connect different devices to the distribution strip 1 said distribution strip 1 comprises different connection devices 30, 32. The connection devices 30, 32 are divided into nine groups in the distribution strip 1 shown. Each group comprises here seven connection devices 30 of a first type and one connection device 32 of a second type.

In a central region of the distribution strip 1 a display device 34 for displaying the power consumption of the connection devices 30, 32 or the consumers connected thereto is provided on the first longitudinal side 4. There are also a data connection and a reset switch 38 in the central region of the distribution strip 1. The display device 34 can be designed as an LCD display or a multi-segment display.

Three recesses 22 for feed cables 20 are provided on a second longitudinal side 6 adjacent to the front side. The recesses 22 are in an approximately central region of the distribution strip 1.

Figure 2:
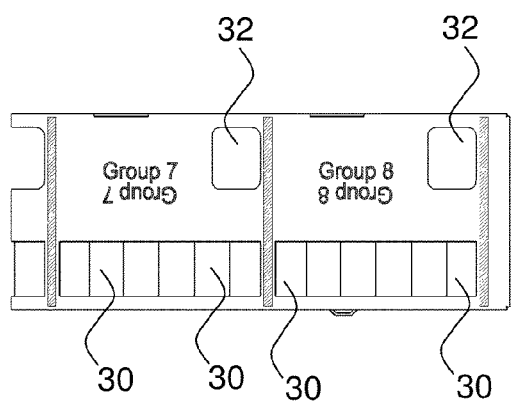
FIG. 2 shows an enlarged region of the distribution strip of FIG. 1.

FIG. 2 shows in an enlarged representation a region of the connection strip 1 with two groups of connection devices 30, 32. Each group comprises seven of the same connection devices 30 which are arranged in a row along the distribution strip 1. A further connection device 32 is arranged spaced apart from the seven same connection devices 30. At the ends of the distribution strip 1 there can be respective fixing devices for fixing the distribution strip 1 to the equipment cabinet 50 which can be designed as collar-like extensions of a side.

Figure 3:
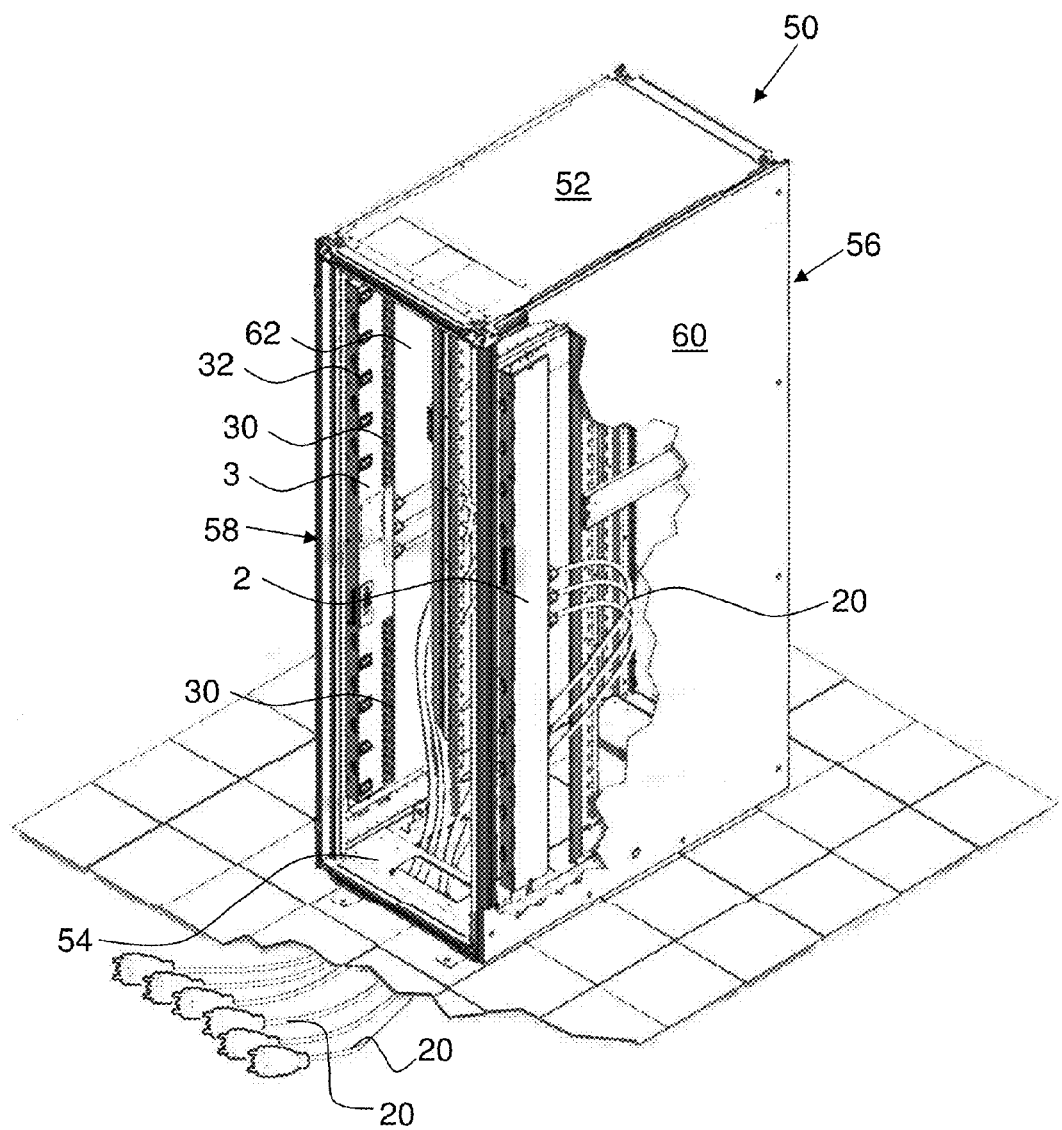
FIG. 3 shows a perspective view of an equipment cabinet with two distribution strips and downwardly guided feed cables.

FIG. 3 shows a perspective view of an equipment cabinet 50 with two incorporated distribution strips 2, 3. The equipment cabinet 50 comprises an upper side 52, a lower side 54, a front side 56, a rear side 58, a first side wall 60 and a second side wall 62. A first distribution strip 2 is arranged in a rear region of the equipment cabinet 50 in a corner region between the rear side 58 and the first side wall 60. A longitudinal axis of the first distribution strip 2 extends essentially parallel to all longitudinal sides 4, 6, 8, 10 and vertically between the lower side 54 and upper side 52 of the equipment cabinet 50. A transverse axis extends parallel to the first longitudinal side 4 and to the end faces 12, 14 of the distribution strip 2. The front side of the distribution strip 2 is orientated parallel to the side walls 60, 62. The second longitudinal side 6 of the distribution strip 2, from which the feed cables 20 are guided, extends parallel to the front or rear side 56, 58 of the equipment cabinet 50. A second distribution strip 3 is arranged in a second corner region of the equipment cabinet 50. The second corner region is located between the rear side 58 and the second side wall 62 of the equipment cabinet 50. In this description of the drawing an ideal orientation and fixing of the distribution strips is assumed. In actually incorporated distribution strips there is accordingly only an essentially parallel, perpendicular and vertical orientation.

The feed cables 20 are guided essentially horizontally out of the distribution strips 2, 3 and extend further in a curved form parallel to the first or second side wall 60, 62 of the equipment cabinet 50 downwards. The cables are guided out through an opening in the lower side 54 of the equipment cabinet 50. Essentially the lateral space between devices arranged in the equipment cabinet 50 and the side wall 60, 62 is available for laying the feed cables 20. Due to this large amount of space available for the feed cables 20 said feed cables 20 can have large diameters and be laid with correspondingly large bending radii.

Figure 4:
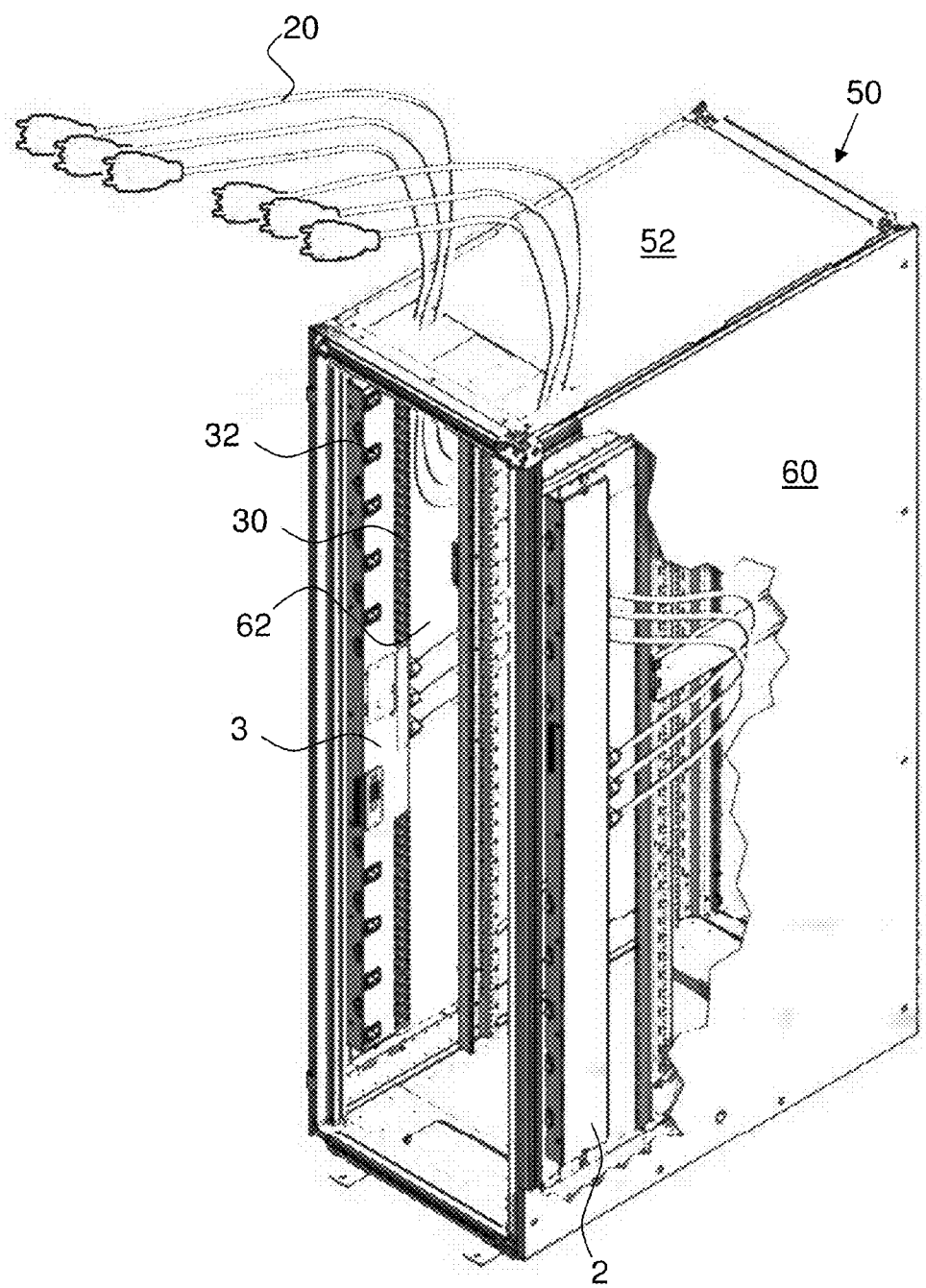
FIG. 4 shows a perspective view of an equipment cabinet with two distribution strips and upwardly guided feed cables.

FIG. 4 shows an alternative guiding of the feed cables 20. The feed cables 20 are guided along the first or second side wall 60, 62 upwards and through an opening in the upper side 52 out of the equipment cabinet 50. The exit of the feed cables 20 from the equipment cabinet 50 takes place in a rear, side region of the upper side 52.

All in all the inventive distribution strip and the inventive equipment cabinet facilitate a powerful power supply of consumers in an equipment cabinet. In particular the use of a feed cable with a large diameter and correspondingly large bending radius is facilitated.

The invention claimed is:

1. A server cabinet for receiving at least one of electrical devices and electronic devices comprising a distribution strip for distributing electrical energy to the at least one of electrical and electronic devices arranged in the server cabinet, the distribution strip defining a longitudinal direction, wherein the distribution strip comprises:
a plurality of electrical connection devices to which electrical consumers can be connected,
at least one feed cable for connecting the distribution strip to an energy source,
at least one fixing region for fixing the distribution strip to the server cabinet,
wherein the electrical connection devices are arranged on a first longitudinal side of the distribution strip, wherein the distribution strip is operable to be fixed by means of the fixing region in a vertical orientation in a region of a side wall to the server cabinet, and wherein the at least one feed cable is arranged on a second longitudinal side of the distribution strip adjacent to the first longitudinal side wherein the at least one feed cable of the distribution strip is connected centrally on the second longitudinal side of the distribution strip with respect to the longitudinal direction of the distribution strip.

2. The server cabinet according to claim 1, further comprising a plurality of fixing devices for fixing of the distribution strip in the server cabinet in at least two orientations, whereby the distribution strip is rotated in a second orientation by 180° about its transverse axis in relation to a first orientation.

3. The server cabinet according to claim 1, wherein at least two of the plurality of electrical connection devices are different from each other.

4. The server cabinet according to claim 1, wherein the at least one feed cable includes three feed cables.

5. The server cabinet according to claim 1, wherein the electrical connection devices are divided into a plurality of groups that are functionally separated from each other.

6. The server cabinet according to claim 1, wherein at least two inscriptions are provided on the distribution strip which are rotated by 180° relative to each other.

7. The server cabinet according to claim 1, further comprising at least one of a data connection device for transmission of data and a measurement module, the at least one of the data connection device and the measurement module being arranged on the distribution strip.

8. The server cabinet according to claim 1, further comprising a display device for displaying current power consumption.

9. The server cabinet according to claim 1, wherein the distribution strip is arranged essentially vertically in a first corner region the side wall.

10. The server cabinet according to claim 1, wherein the at least one feed cable is guided along the side wall of the server cabinet.

11. The server cabinet according to claim 1, wherein the distribution strip is operable to be selectively and alternatively fixed in a first orientation in a first corner region of the server cabinet and in a second orientation in a second corner region of the server cabinet lying opposite the first corner region, whereby the distribution strip is rotated in the second orientation by 180° about its transverse axis in relation to the first orientation.

12. The server cabinet according to claim 1, wherein the distribution strip has a length which corresponds essentially to a height of an inner space of the server cabinet.

13. The server cabinet according to claim 1, wherein the second longitudinal side is attached to and extends away from the first longitudinal side at a positive angle.

14. The server cabinet according to claim 13, wherein the positive angle is approximately 90°.

15. The server cabinet according to claim 1, wherein the distribution strip includes the first longitudinal side, the second longitudinal side, and a third longitudinal side, the third longitudinal side facing the side wall of the server cabinet, the first longitudinal side facing away from the side wall of the server cabinet, and the second longitudinal side extending between and attached to both the first and third longitudinal sides.

16. The server cabinet according to claim 15, wherein the distribution strip also includes a fourth longitudinal side that extends between and that is attached to both the first and third longitudinal sides, the fourth and second longitudinal sides being substantially perpendicular to the first and third longitudinal sides.

* * * * *

UNITED STATES PATENT AND TRADEMARK OFFICE
CERTIFICATE OF CORRECTION

PATENT NO. : 8,187,028 B2  Page 1 of 1
APPLICATION NO. : 13/122847
DATED : May 29, 2012
INVENTOR(S) : Josef Feigl It is certified that error appears in the above-identified patent and that said Letters Patent is hereby corrected as shown below:

Column 8,
Line 3, Claim 9, after "region" insert --of--.

Signed and Sealed this
Eighth Day of January, 2013

David J. Kappos
*Director of the United States Patent and Trademark Office*